United States Patent [19]

Hanibuchi et al.

[11] Patent Number: 5,164,617
[45] Date of Patent: Nov. 17, 1992

[54] HIGH SPEED BICMOS LOGIC CIRCUIT

[75] Inventors: Toshiaki Hanibuchi; Masahiro Ueda, both of Hyogo, Japan

[73] Assignee: Mitsubishi Denki Kabushiki Kaisha, Tokyo, Japan

[21] Appl. No.: 703,870

[22] Filed: May 23, 1991

[30] Foreign Application Priority Data

Jun. 5, 1990 [JP] Japan .................. 2-148183

[51] Int. Cl.⁵ .................. H03K 17/04; H03K 19/01
[52] U.S. Cl. .................. 307/446; 307/443; 307/450
[58] Field of Search ............. 307/443, 451, 456, 450, 307/446

[56] References Cited

U.S. PATENT DOCUMENTS

| 4,661,723 | 4/1987 | Masuda et al. | 307/446 |
| 4,719,373 | 1/1988 | Masuda et al. | 307/446 |
| 4,829,201 | 5/1989 | Masuda et al. | 307/451 |
| 4,890,018 | 12/1989 | Fukushi et al. | |
| 4,999,523 | 3/1991 | Cham et al. | 307/446 |
| 5,001,365 | 3/1991 | Murabayashi et al. | 307/446 |

FOREIGN PATENT DOCUMENTS 59-11034  1/1984  Japan.

Primary Examiner—Edward P. Westin
Assistant Examiner—Richard Roseen
Attorney, Agent, or Firm—Lowe, Price, LeBlanc & Becker

[57] ABSTRACT

A signal applied through a signal input terminal is logically processed by a logic circuit such as a CMOS inverter and the processed signal is supplied from the signal output terminal. A pinch resistor has a resistance value controlled in accordance with a variation of a voltage at the signal output terminal. Specifically, the pinch resistor has a higher resistance value at an initial stage in the switching operation in which an output from the logic circuit lowers from a logical high level to a logical low level, and supplies a large base current to a bipolar transistor. At a later stage in the switching operation, the pinch resistor has a small resistance value, so that a residual charge in the signal output terminal and a base charge in the bipolar transistor are rapidly emitted through the pinch resistor. Thus, the resistance value of the pinch resistor is always maintained at an optimum value, which increases a speed of the switching operation of the logic circuit.

9 Claims, 4 Drawing Sheets

HIGH SPEED BICMOS LOGIC CIRCUIT

BACKGROUND OF THE INVENTION

1. Field of the Invention

The present invention relates to a logic circuit device, and particularly to a logic circuit device provided with a circuit for increasing a switching speed.

2. Description of the Prior Art

FIG. 4 is a circuit diagram illustrating essential structures of a BiCMOS logic circuit disclosed in the Japanese Laid-Open Patent Publication No. 59-11034. In the figure, the BiCMOS logic circuit is so constructed that a signal inputted through a signal input terminal 1 is inverted, and then is outputted from a signal output terminal 2. This BiCMOS logic circuit consists of a P-channel MOS transistor 3 (will be called as "PMOS transistor"), a N-channel MOS transistor 4 (will be called as "NMOS transistor"), npn bipolar transistors 5 and 6, and resistors 7 and 8. The PMOS transistor 3 and the NMOS transistor 4 are interposed in series between a power source $V_{cc}$ and a ground GND to form a so-called CMOS inverter. The resistor 7 is disposed between the PMOS transistor 3 and the NMOS transistor 4, and the resistor 8 is disposed between the NMOS transistor 4 and the ground GND. The gates of the PMOS transistor 3 and the NMOS transistor 4 are connected to the signal input terminal 1. A connection between the resistor 7 and the NMOS transistor 4 is connected to the signal output terminal 2. The bipolar transistor 5 has a collector connected to the power source $V_{cc}$, an emitter connected to the signal output terminal 2, and a base connected to a connection between the PMOS transistor 3 and the resistor 7. The bipolar transistor 6 has a collector connected to the signal output terminal 2, an emitter connected to the ground GND, and a base connected to a connection between the NMOS transistor 4 and the resistor 8.

FIG. 5 is a cross section illustrating a part of laminated structures of a semiconductor substrate and the BiCMOS logic circuit shown in FIG. 4. In FIG. 5, there are formed on a surface layer of a P-type semiconductor substrate 10, a N+ impurity diffusion layer 4d forming a drain of the NMOS transistor 4 in FIG. 4 and a N+ impurity diffusion layer 4s forming a source thereof with a predetermined space therebetween. A gate electrode 4g is formed on the semiconductor substrate 10 with an insulator film therebetween and is located in an area between these impurity diffusion layers 4d and 4s. There are also formed on the surface layer of the semiconductor substrate 10 a N+ impurity diffusion layer 6c forming the collector of the bipolar transistor 6 in FIG. 4, a P+ impurity diffusion layer 6b forming the base thereof and a N+ impurity diffusion layer 6e forming the emitter thereof. Further, a P+ impurity diffusion layer 80 which forms the resistor 8 in FIG. 4 is formed on the surface layer of the semiconductor substrate 10. It should be noted that a thick insulator film 11 is provided to separate the bipolar transistor 6 consisting of the impurity diffusion layers 6c, 6b and 6e and the resistor 8 consisting of the impurity diffusion layer 80.

FIG. 6 is a voltage waveform diagram illustrating a manner in which an output voltage $V_{out}$ at the signal output terminal 2 varies in accordance with the variation of an input voltage $V_{in}$ at the signal input terminal 1 in the BiCMOS logic circuit shown in FIG. 4. Now, operations of the conventional logic circuit shown in FIG. 4 will be described with reference to FIG. 6.

Before a switching operation of the logic circuit, the input voltage $V_{in}$ at the signal input terminal 1 is in a "L" level. Therefore, the NMOS transistor 4 is turned off, and the PMOS transistor 3 is turned on. Accordingly, the signal output terminal 2 is connected through the resistor 7 and the PMOS transistor 3 to the power source $V_{cc}$, and thus the output voltage $V_{out}$ at the signal output terminal 2 is in a "H" level.

When the input voltage $V_{in}$ at the signal input terminal 1 varies to the "H" level, the NMOS transistor 4 is turned on, and the PMOS transistor 3 is turned off. As a result, a charge which has been charged in a load capacity (not shown) connected to the signal output terminal 2 is discharged through the NMOS transistor 4 and the resistor 8 to the ground GND (period t1).

The above discharged current flows through the resistor 8 to the ground GND, and also forms a base current of the bipolar transistor 6 to turn on it. As a result, owing to a high current driving ability of the bipolar transistor 6, the charge in the signal output terminal 2 is rapidly discharged (period t2).

When the potential at the signal output terminal 2 decreases to some extent, the end voltages of the resistor 8 have a value smaller than a voltage between the base and emitter required for turning on the bipolar transistor 6, so that the bipolar transistor 6 shifts to an off state. Thereafter, a residual charge in the signal output terminal 2 is discharged through the NMOS transistor 4 and the resistor 8 (period t3). The charge accumulated in the base of the bipolar transistor 6 is also discharged through the resistor 8 in this period t3.

As apparent from the above description, the resistor 8 in the logic circuit shown in FIG. 4 performs two functions in the switching operation. That is; the resistor 8 functions to supply the current from the NMOS transistor 4 to the base of the bipolar transistor 6 at an initial stage in the switching operation, and also functions to discharge the residual charge in the signal output terminal 2 and the base charge in the bipolar transistor 6 at a later stage in the switching operation. With respect to the former function, a higher resistance of the resistor 8 is preferable in view of a higher speed of the switching operation, because the higher resistance of the resistor 8 can supply a larger base current for the bipolar transistor 6. On the other hand, in view of the latter function, the lower resistance of the resistor 8 is preferable, because the lower resistance can reduce the discharging time of the residual charge in the signal output terminal 2 and the base charge of the bipolar transistor 6.

As described above, the resistance of the resistor 8 is preferable to be high at the initial stage in the switching operation and to be low at the later stage. Therefore, the above points have been totally taken into consideration in the design of the conventional circuit shown in FIG. 4, in which the resistor 8 has a resistance of a pre-calculated value which can achieve the highest speed of the switching operation on an average. However, even if the resistor 8 is set to have such resistance, the resistance can not always be of an optimum value for the every operating condition of the circuit, because the resistor 8 is a fixed resistor. Accordingly, the conventional logic circuit shown in FIG. 4 still has a problem concerning a speed of the switching operation.

As shown in FIG. 5, it is required in the conventional BiCMOS logic circuit to separate a formation region for the bipolar transistor 6 and that for the resistor 8 from each other, which disadvantageously increases a circuit area. This is due to a fact that the resistance of the resistor 8 is strictly required to be of the optimum value obtained from the calculation as described above, and thus it is necessary to prevent variation of the resistance of the resistor 8, which may be caused by an influence on the P+ impurity layer 80 by the impurity diffusion region forming the bipolar transistor.

SUMMARY OF THE INVENTION

An object of the invention is to provide a logic circuit device of which switching operation speed is increased.

Another object of the invention is to provide a logic circuit device in which a resistance of the resistor contributing to a switching operation at a high speed is always maintained at an optimum value independently of a variation of an operating condition of a circuit.

A further object of the invention is to provide a logic circuit device having an occupied area of a circuit which is smaller than that of the conventional semiconductor integrated circuit.

A logic circuit device according to the invention comprises logical processing means interposed between a signal input and a signal output for performing a predetermined logical processing, speed increasing means for increasing a speed of variation of a potential at the signal output in accordance with a variation of an output from the logical processing means. The speed increasing means includes switch means and variable resistor means. The switch means has a control terminal for receiving a control signal from the logical processing means, and is adapted to be turned on and off under the control of the control signal and to form a current path between the signal output and a reference potential source when turned on. The variable resistor means is interposed between the control terminal of the switch means and the reference potential source, and has a resistance which varies in accordance with the potential at the signal output.

According to the invention, the resistance of the variable resistor means varies in accordance with the potential at the signal output terminal, and the control signal applied to the control terminal of the switch means is controlled by the variation of the resistance of the variable resistor means. That is; the resistance of the variable resistor means varies in accordance with the variation of the circuit condition in the switching operation of the logic circuit device, and is always maintained at the optimum value. Consequently, a rapid switching operation is achieved.

The foregoing and other objects, features, aspects and advantages of the present invention will become more apparent from the following detailed description of the present invention when taken in conjunction with the accompanying drawings.

BRIEF DESCRIPTION OF THE PREFERRED EMBODIMENTS

Figure 1:
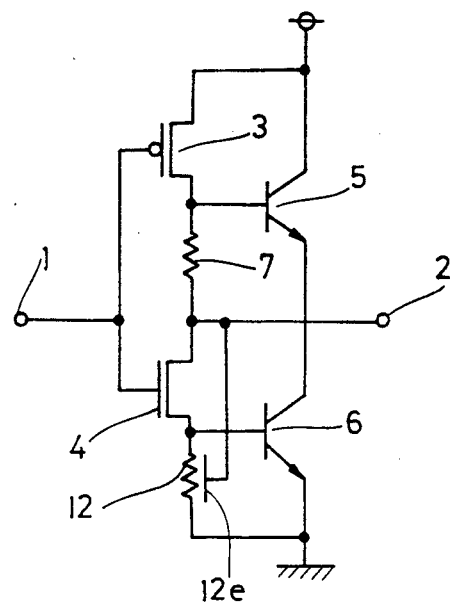
FIG. 1 is a circuit diagram illustrating structures of an embodiment of the invention.
Figure 4:
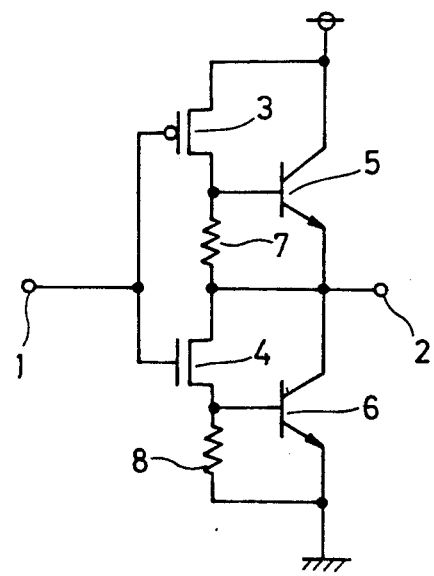
FIG. 4 is a circuit diagram illustrating structures of a conventional logic circuit device.

FIG. 1 is a circuit diagram illustrating structures of an embodiment of the invention. A logic circuit device shown in FIG. 1 is provided with variable resistor means such as a so-called pinch resistor 12 in place of the resistor 8 in the conventional circuit shown in FIG. 4. This pinch resistor 12 has a resistance control terminal 12e, and is adapted to vary a resistance thereof in accordance with a voltage applied to this resistance control terminal 12e. The resistance control terminal 12e is connected to a signal output terminal 2. Other structures are similar to those in the conventional circuit shown in FIG. 4. Corresponding parts bear same reference numbers and will not be described hereinafter.

Figure 2:
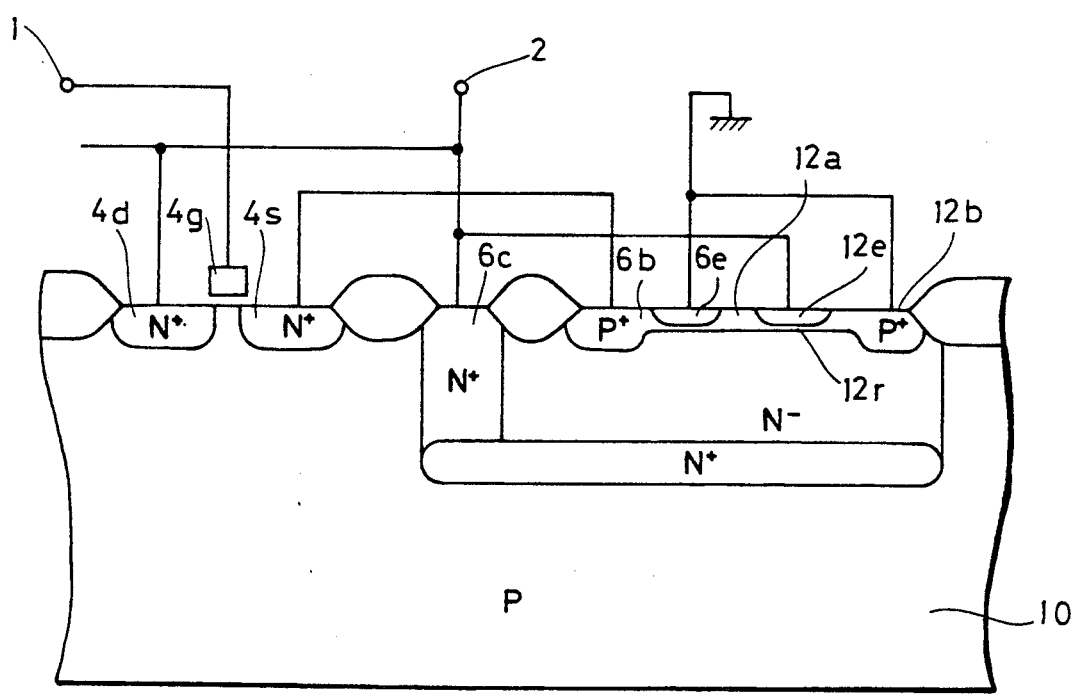
FIG. 2 is a cross section illustrating laminated structures on a semiconductor substrate in an essential part of an embodiment shown in FIG. 1.
Figure 5:
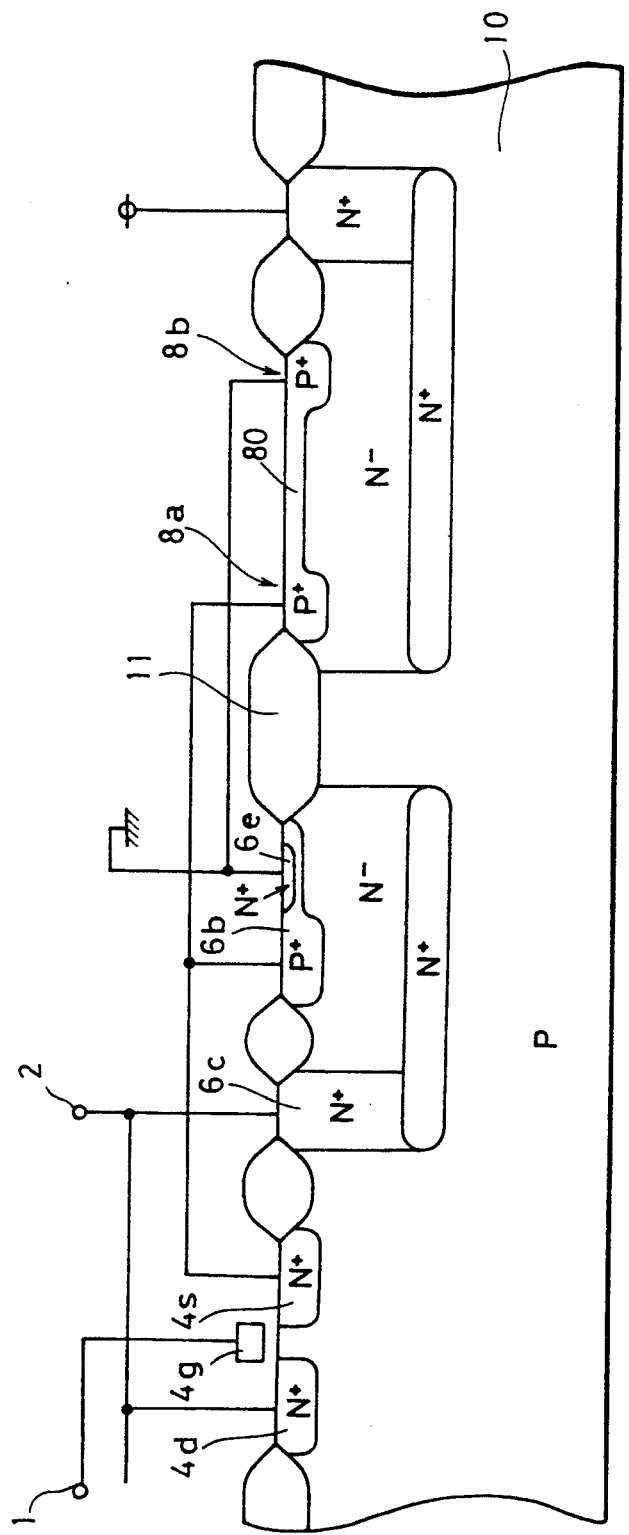
FIG. 5 is a cross section illustrating laminated structures on a semiconductor substrate in a part of a conventional circuit shown in FIG. 4.
Figure 6:
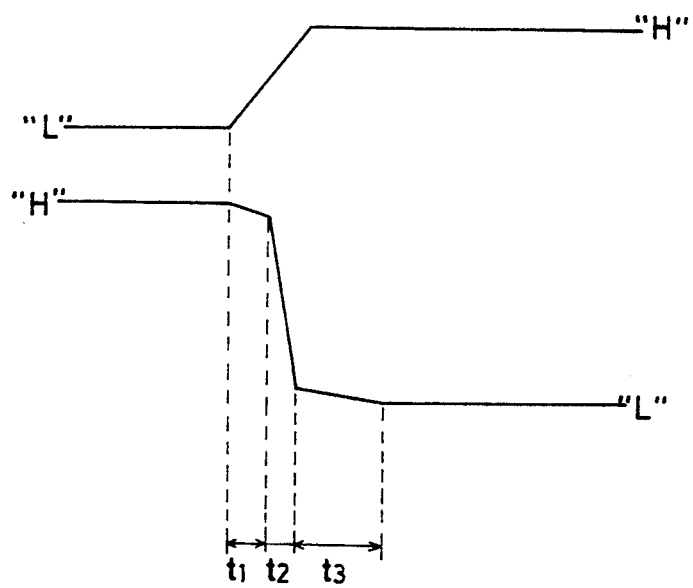
FIG. 6 is a voltage waveform diagram illustrating a variation of an output voltage with respect to a variation of an input voltage in a conventional circuit shown in FIG. 4.

FIG. 2 is a cross section illustrating laminated structures on a semiconductor substrate at an essential part of the embodiment shown in FIG. 1. In the figure, the pinch resistor 12 in FIG. 1 consists of a P+ impurity diffusion layer 12r formed on a surface layer of a semiconductor substrate 10, and a N+ impurity diffusion layer 12e formed in this P impurity diffusion layer 12r. The P+ impurity diffusion layer 12r forms a current path in the pinch resistor 12, and thus will be called as a resistor conductive layer 12r. The N+ impurity diffusion layer 12e corresponds to the resistance control terminal 12e in FIG. 1, and thus will be called as a resistance control layer 12e. The resistance control layer 12e is connected to a signal output terminal 2. The pinch resistor 12 thus constructed has same structures as a P-type junction field effect transistor (PJFET), in which a resistance thereof varies in accordance with a value of a voltage applied to the resistance control layer 12e. That is; when the voltage applied to the resistance control layer 12e from the signal output terminal 2 is high, a depletion region increases in the resistor conductive layer 12r, and thus the resistance of the resistor conductive layer 12r increases. On the other hand, when the voltage applied to the resistance control layer 12e from the signal output terminal 2 is low, the depletion region decreases in the resistor conductive layer, and thus the resistance of the resistor conductive layer 12r decreases. The pinch resistor 12 is not separated from the bipolar transistor 6 and is fused at an end 12a of the resistor conductive layer with the P+ impurity region 6b which forms a base layer of the bipolar transistor 6. That is; the base layer 6b of the bipolar transistor 6 and the resistor conductive layer 12r are formed as an integral impurity diffusion layer. In other words, an extended portion of the base layer 6b forms the resistor conductive layer 12r. The resistor conductive layer 12r is connected at the other end 12b to the ground GND. Other structures are same as the laminated structures in the conventional circuit shown in FIG. 5.

As described above, it is not necessary to separate the formation region for the pinch resistor 12 and the formation region for the bipolar transistor 6 from each other on the semiconductor substrate 10 in this embodiment, and thus the circuit area can be small. This can be achieved owing to a fact that the resistance of the pinch resistor 12 always varies to maintain the optimum value in accordance with the voltage applied to the resistance control layer 12e, and thus it is not necessary to strictly determine the resistance to a calculated value which has been required in the conventional circuit in FIG. 4.

Operations of the embodiment shown in FIGS. 1 and 2 will be described below. The pinch resistor 12 has structures similar to the PJFET as described previously, and can control its own resistance by the resistance control layer 12e having the gate function. This resistance has a higher value when the higher voltage is applied to the resistance control terminal 12e, owing to the nature of the PJFET, and has a lower resistance when a lower voltage is applied thereto. In the switching operation in which the output voltage $V_{out}$ at the signal output terminal 2 lowers from the "H" level to the "L" level, the output voltage $V_{out}$ has the high potential at an initial stage in the switching operation. Thus, the pinch resistance 12 has the high resistance at the initial stage in the switching operation. Therefore, this pinch resistor 12 can supply a large current to the base of the bipolar transistor 6 to increase a capability of the bipolar transistor 6. At the later stage in the switching operation, the output voltage $V_{out}$ at the signal output terminal 2 has the low potential, and thus the pinch resistor 12 has the lower resistance. Therefore, the pinch resistor 12 can rapidly extract the residual charge in the signal output terminal 2 and the base charge in the bipolar transistor 6. As described above, the resistance of the pinch resistor 12 is always maintained at the optimum value in accordance with the operating condition of the logic circuit. Therefore, the logic circuit in this embodiment can perform the rapid switching operation, as compared with the conventional circuit shown in FIG. 4.

Figure 3:
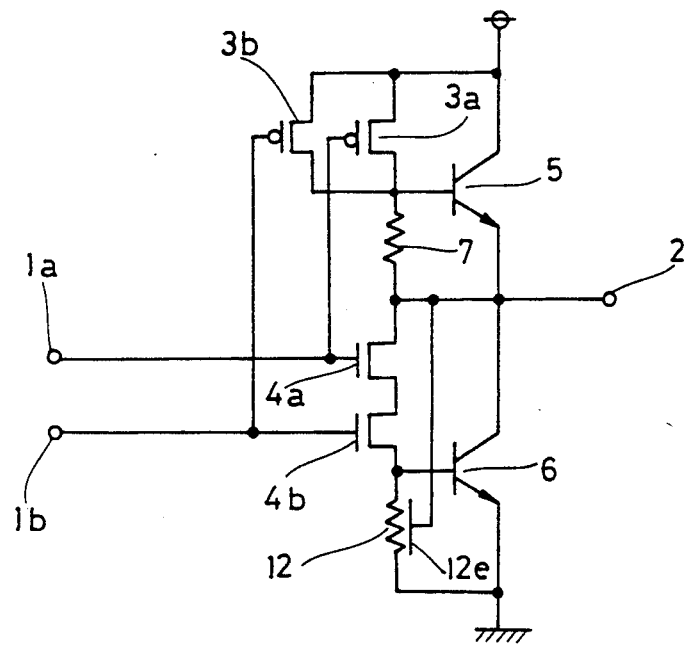
FIG. 3 is a circuit diagram illustrating structures of another embodiment of the invention.

Although the embodiment described above has the logic circuit consisting of the CMOS inverter, the logic circuit may consist of other structures, such as a NAND circuit or NOR circuit, which perform other logical processing. FIG. 3 illustrates, by way of example, another embodiment in which the logic circuit consists of the NAND circuit.

The logic circuit in the embodiment shown in FIG. 3 is adapted to perform a NAND operation of input signals inputted through a plurality of signal input terminals 1a and 1b (only two are shown in the figure) and outputs a result from a signal output terminal 2. For this purpose, the signal input terminal 1a is associated to a PMOS transistor 3a and a NMOS transistor 4a, and the signal input terminal 1b is associated to a PMOS transistor 3b and a NMOS transistor 4b. The PMOS transistors 3a and 3b are connected in parallel and one of their common connections is connected to the power source $V_{cc}$. The other common connection is connected to the base of the bipolar transistor 5 and is also connected through the resistor 7 to the signal output terminal 2. The NMOS transistors 4a and 4b are connected in serial, and are interposed between the signal output terminal 2 and the base of the bipolar transistor 6. The pinch resistor 12 is interposed between the base of the bipolar transistor and the ground GND. Gates of the PMOS transistor 3a and the NMOS transistor 4a are connected to the corresponding signal input terminal 1a. Gates of the PMOS transistor 3b and the NMOS transistor 4b are connected to the corresponding signal input terminal 1b.

The pinch resistor 12 and the bipolar transistor 6, which are features of the embodiment in FIG. 3 having structures described, operate in a same manner as the embodiment in FIG. 1. The operation of the NAND circuitry is also well known. Thus, the operations of the embodiment in FIG. 3 are not described herein.

According to the invention, as described hereinabove, the resistance of the variable resistor means for controlling the control signal applied to the control terminal of the switch means is always set at the optimum value in accordance with the potential at the output terminal. Therefore, the speed of the switching operation can be increased, as compared with conventional logic circuit device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A logic circuit device which performs a predetermined logical processing of a signal applied to a signal input and supplies a processed signal to a signal output, comprising:

logical processing means interposed between said signal input and said signal output for performing said predetermined logical processing;

speed increasing means for increasing a speed of variation of a potential at said signal output in accordance with a variation of an output from said logical processing means;

said speed increasing means including:

switch means having a control terminal for receiving a control signal from said logical processing means, to be turned on and off under the control of said control signal and to form a current path between said signal output and a firs reference potential source when turned on, and variable resistor means comprising a pinch resistor interposed between said control terminal of said switch means and said first reference potential source, and having a resistance value which varies in direct proportion to the potential at said signal output;

said control signal applied to said control terminal of said switch means being controlled in accordance with the variation of the resistance value of said variable resistor means;

wherein;

said logic circuit device is formed on a semiconductor substrate;

a bipolar transistor has a base layer, an emitter layer and a collector layer formed on said semiconductor substrate;

said pinch resistor has a resistor conductive layer formed on said semiconductor substrate, a resistance control layer is formed in said resistor conductive layer to control the resistance value of said resistor conductive layer by increasing or decreasing a depletion region in said resistor conductive layer in accordance with a voltage applied form said signal output terminal; and said base layer and said resistor conductive layer are of the same conductivity type and are electrically connected together.

2. A logic circuit device according to claim 1, wherein said switch means is said bipolar transistor which is interposed between said signal output terminal and said first reference potential source and said bipolar transistor has a base to which said control signal is applied.

3. A logic circuit device according to claim 1, wherein said base layer and said resistor conductive layer are formed of an integral impurity diffusion layer.

4. A logic circuit device according to claim 1, wherein said logical processing means is a CMOS inverter.

5. A logic circuit device according to claim 4, wherein said CMOS inverter includes:
  a P-channel MOS transistor interposed between a second reference potential source and said signal output, and
  an N-channel MOS transistor interposed between said signal output and said control terminal of said switch means; and
  respective gates of said P-channel MOS transistor and said N-channel MOS transistor are connected to said signal input.

6. A logic circuit device according to claim 5, wherein said switch means is turned on to form a discharge path for said signal output when an output from said CMOS inverter varies from a logical high level to a logical low level.

7. A logic circuit device according to claim 1, wherein said logical processing means is a NAND circuit for performing NAND operation of a plurality of signals supplied from a plurality of signal inputs.

8. A logic circuit device according to claim 7, wherein said NAND circuit includes:
  a plurality of P-channel MOS transistors interposed in parallel between a second reference potential source and said signal output, and
  a plurality of N-channel MOS transistors interposed in series between said signal output and said control terminal of said switch means, and wherein
  said P-channel MOS transistors and said N-channel MOS transistors have gates, and said gates of the corresponding P-channel and N-channel MOS transistors are connected in common to said signal inputs corresponding thereto, respectively.

9. A logic circuit device according to claim 8, wherein said switch means is turned on to form a discharge path for said signal output when an output from said NAND circuit varies from a logical high level to a logical low level.

* * * * *